United States Patent
Chang et al.

(10) Patent No.: US 9,012,337 B2
(45) Date of Patent: Apr. 21, 2015

(54) PLATEN CONTROL

(75) Inventors: Shengwu Chang, South Hamilton, MA (US); Joseph C. Olson, Beverly, MA (US); Frank Sinclair, Quincy, MA (US); Matthew P. McClellan, Lancaster, MA (US); Antonella Cucchetti, Manchester by the Sea, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 718 days.

(21) Appl. No.: 13/270,644

(22) Filed: Oct. 11, 2011

(65) Prior Publication Data

US 2012/0088035 A1    Apr. 12, 2012

Related U.S. Application Data

(60) Provisional application No. 61/392,196, filed on Oct. 12, 2010.

(51) Int. Cl.
*H01L 21/027* (2006.01)
*H01L 21/66* (2006.01)
*H01L 21/67* (2006.01)

(52) U.S. Cl.
CPC .... *H01L 21/67109* (2013.01); *H01L 21/67288* (2013.01)

(58) Field of Classification Search
USPC .................. 451/7, 8, 9, 41, 53; 432/253, 258; 118/500, 728
See application file for complete search history.

(56) References Cited

U.S. PATENT DOCUMENTS

| 5,851,929 | A | 12/1998 | Thakur et al. |
| 6,416,384 | B1 * | 7/2002 | Kawamoto et al. ............... 451/7 |
| 6,709,267 | B1 * | 3/2004 | Hawkins et al. ............... 432/258 |
| 2003/0073383 | A1 * | 4/2003 | Lee et al. ............... 451/7 |
| 2005/0070208 | A1 | 3/2005 | Beaucage et al. |
| 2008/0299784 | A1 | 12/2008 | Jin et al. |

FOREIGN PATENT DOCUMENTS

| EP | 1345480 A2 | 9/2003 |
| EP | 1796145 A1 | 6/2007 |
| KR | 100793170 B1 | 1/2008 |
| WO | 2006080290 A1 | 8/2006 |

* cited by examiner

Primary Examiner — David B Jones

(57) ABSTRACT

A system and method for maintain a desired degree of platen flatness is disclosed. A laser system is used to measure the flatness of a platen. The temperature of the platen is then varied to achieve the desired level of flatness. In some embodiments, this laser system is only used during a set up period and the resulting desired temperature is then used during normal operation. In other embodiments, a laser system is used to measure the flatness of the platen, even while the workpiece is being processed.

14 Claims, 8 Drawing Sheets

PLATEN CONTROL

This application claims priority to U.S. Provisional Patent Application Ser. No. 61/392,196, filed Oct. 12, 2010, the disclosure of which is incorporated herein by reference in its entirety.

FIELD

This disclosure relates to platens, and more particularly, to platen flatness control.

BACKGROUND

A platen supports a workpiece for treatment by a processing tool. The platen may be an electrostatic platen that clamps the workpiece to the platen with electrostatic forces. The platen may also be a mechanical platen that clamps a workpiece with mechanical forces. The platen has a clamping surface that supports the workpiece. The workpiece may include, but not be limited to, a semiconductor substrate, a solar cell, a polymer substrate, and a flat panel. A platen may be used in many differing types of processing tools including, but not limited to, an ion implanter, a deposition tool, and an etch tool.

The clamping surface of the platen ideally has a high level of flatness. However, different conditions such as operating temperature may adversely impact the flatness of the clamping surface. For example, some electrostatic platens may be fabricated of different layers that are joined by a bonding agent such as epoxy. The different layers may have a different coefficients of thermal expansion (CTE) so that they expand and contract at different rates depending on the temperature.

FIG. 1 illustrates a cross sectional view of a platen 100 having clamping layer 102 a support layer 104. In one instance, the clamping layer 102 may be fabricated of a ceramic and the support layer 104 may be fabricated of aluminum. The platen 100 may be domed 100a or bowed 100b relative to treatment 106, e.g., by an ion beam in one instance. This curving of the platen may degrade results from the processing tool having such a platen.

In one instance, the processing tool may be a beam line ion implanter that treats a workpiece with an ion beam. For an angle sensitive application, any substantial deviation of the clamping surface of the plate from ideal flatness may degrade results. For example, one such application is a channeling ion implant into a semiconductor wafer workpiece. The semiconductor wafer may be fabricated of silicon and the crystalline lattice of the silicon may be oriented to promote channeling. If the angle of incidence varies slightly from a desired angle, the amount of channeling may be adversely reduced. The reduction in channeling is typically exacerbated at higher ion beam energies. Controlling the angle of incidence also helps to improve uniformity of the dose into a semiconductor wafer or other workpiece.

Accordingly, it would be desirable to provide an apparatus and method to control the flatness of the platen which overcomes the above-described inadequacies and shortcomings.

SUMMARY

A system and method for maintain a desired degree of platen flatness is disclosed. A laser system is used to measure the flatness of a platen. The temperature of the platen is then varied to achieve the desired level of flatness. In some embodiments, this laser system is only used during a set up period and the resulting desired temperature is then used during normal operation. In other embodiments, a laser system is used to measure the flatness of the platen, even while the workpiece is being processed.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
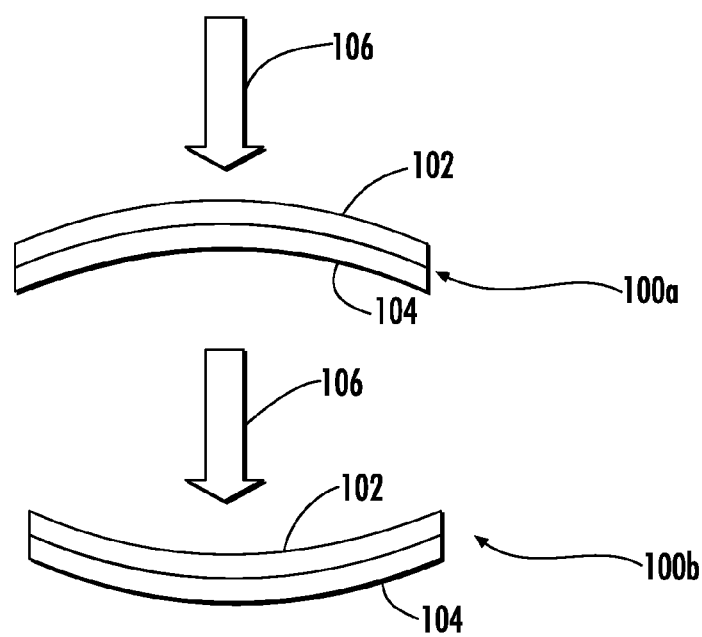
FIG. 1 is a cross sectional view of a platen having a domed and bowed shape.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
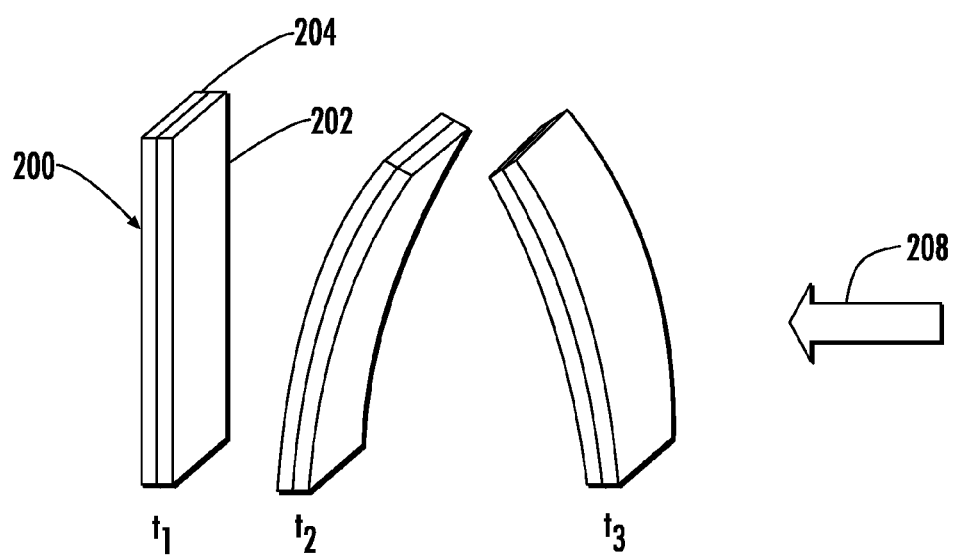
FIG. 2 is a perspective view of a platen at different operating temperatures.

Turning to FIG. 2, a perspective view of a platen 200 consistent with an embodiment of the disclosure is illustrated. The platen 200 has a clamping layer 202 and a support layer 204. In one embodiment, the clamping layer 202 may be fabricated of a ceramic and the support layer 204 may be fabricated of aluminum. Other materials known to those skilled in the art may also be utilized. FIG. 2 illustrates that at first operating temperature ($t_1$), the platen 200 has a high degree of flatness. In contrast, at a second operating temperature ($t_2$), the platen 200 is bowed (or concave) relative to treatment 208. Finally, at a third operating temperature ($t_3$), the platen 200 is domed (or convex) relative to the treatment 208. In one embodiment, ($t_1$)<($t_2$) and ($t_1$)>($t_3$). Further, ($t_1$) may be 27° C., ($t_2$) may be 35° C. or greater, and ($t_3$) may be 20° C. or less in one embodiment. Therefore, as illustrated in FIG. 2, there is a first operating temperature ($t_1$) or ideal operating temperature (and a range of temperature about the ideal operating temperature) that results in the platen having a desired level of flatness compared to other operating temperatures ($t_2$) and ($t_3$).

One reason for this bowing may be the difference in the coefficient of thermal expansion (CTE) between the material used in the clamping layer 202 and the material in the support layer 204. For example, in the embodiment shown in FIG. 2, the support layer 204 may have a greater CTE than the clamping layer 202. At elevated temperatures, this causes the support layer 204 to expand more than the clamping layer 202. This causes the platen 200 to bow toward the treatment 208, adopting a concave front surface. Conversely, a decrease in temperature would cause the support layer to contract more than the clamping layer 202, causing the platen 200 to dome relative to the treatment 208, adopting a convex front surface.

Figure 3:
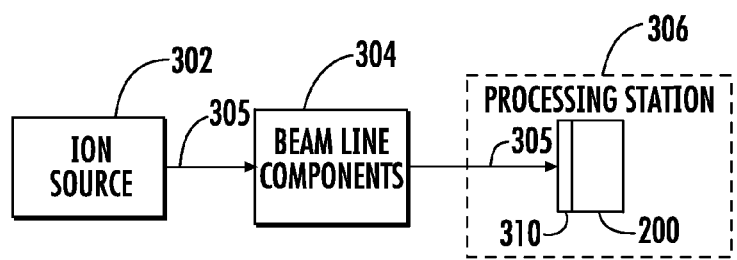
FIG. 3 is a block diagram of one processing tool that may have a platen consistent with an embodiment of the disclosure.

Turning to FIG. 3, a simplified schematic block diagram of a beam line ion implanter 300 is illustrated that may have the platen 200 of FIG. 2 configured to operate over a desired temperature range to minimize platen curvature. Those skilled in the art will recognize that the platen 200 may also be included in other processing tools including, but not limited to, a plasma doping ion implanter, an etch tool, and a deposition tool. The beam line ion implanter 300 includes an ion source 302, beam line components 304, and a processing station 306 that supports one or more workpieces such as a workpiece 310. The ion source 302 generates an ion beam 305 that is directed via the beam line components 304 to the workpiece 310.

The beam line components 304 may include components known to those skilled in art to control and direct the ion beam 305 towards the workpiece 310. Some examples of such beam line components 304 include, but are not limited to, a mass analyzing magnet, a resolving aperture, ion beam acceleration and/or deceleration columns, an energy filter, and a collimator magnet or parallelizing lens. Those skilled in the art will recognize alternative and/or additional beam line components 304 that may be utilized in the ion implanter 300.

The processing station 306 includes the platen 200 that supports one or more workpieces, such as workpiece 310, in the path of ion beam 305 such that ions of the desired species strike the workpiece 310. The workpiece 310 may include, but not be limited to, a semiconductor wafer, a solar cell, a polymer substrate, and a flat panel. The processing station 306 may include a scanner (not illustrated) for moving the workpiece 310 in a desired direction. The processing station 306 may also include additional components known to those skilled in the art. For example, the processing station 306 typically includes automated workpiece handling equipment for introducing workpieces into the ion implanter 300 and for removing workpieces after ion treatment. It will be understood to those skilled in the art that the entire path traversed by the ion beam 305 is evacuated during ion treatment. The ion implanter 300 may also have a controller (not illustrated) to control a variety of subsystems and components of the ion implanter 300.

Figure 4:
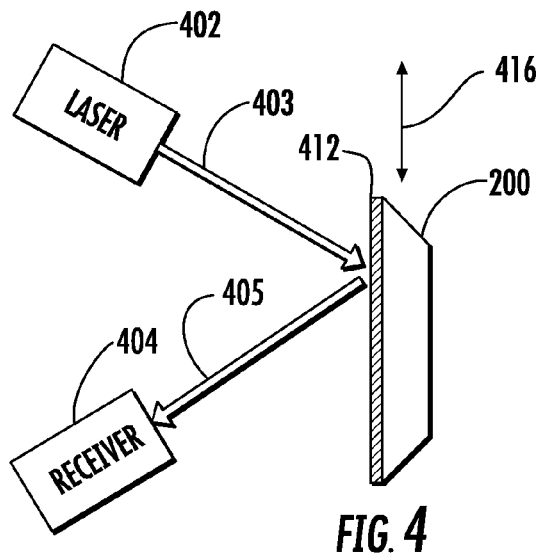
FIG. 4 is side view of a laser system to measure a curvature of a platen.

Turning to FIG. 4, a laser system to measure flatness of a clamping surface of the platen 200 is illustrated. The laser system includes a laser 402 and a receiver 404. The laser 402 is configured to direct a laser beam 403 at a reflective surface. In the embodiment of FIG. 4, a semiconductor wafer 412 is clamped to the clamping surface of the platen 200 to serve as this reflective surface. The semiconductor wafer 412 is typically manufactured to tight tolerances and has a flat reflective surface.

Figure 5:
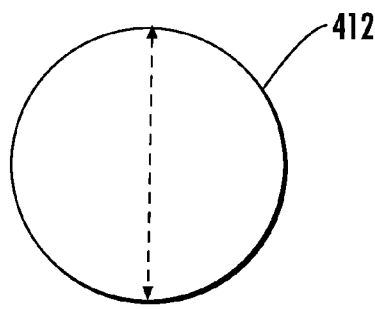
FIG. 5 is a plan view of a platen measured by the laser system of FIG. 4.

In operation, the laser 402 directs the laser beam 403 at the reflective semiconductor wafer 412. The wavelength of the laser beam 403 is not limited by this disclosure and may be any wavelength which is reflected by the reflective surface. The laser beam 403 may be directed towards a center line of the wafer 412 as illustrated in FIG. 5. A scanning system of the processing tool may drive the platen 200 and the semiconductor wafer 412 clamped thereto in one or more directions (e.g., vertical direction, horizontal direction, rotational direction). In one instance, the scanning system may drive the wafer 412 in a vertical direction as indicated by the arrow 416.

The receiver 404 is positioned to receive the laser beam 405 reflected from the semiconductor wafer 412. The received laser beam 405 may be correlated to any deviations in platen flatness. For example, for a perfectly flat clamping surface, the received laser beam 405 would have an expected amplitude so that a received signal less than the expected amplitude could be correlated to a change in the flatness of the clamping surface. In another embodiment, the laser receiver 404 has a large receptor region, such as a CCD camera, which is adapted to receive the reflected beam 405. The receiver 404 may detect the exact position on the receptor region that was struck by the reflected beam 405. The receiver 404 may record and track these positions as the platen 200 is being moved. By correlating the position struck by the reflected laser beam 405 with the position of the platen 200, it is possible to determine the curvature of the platen 200.

Figure 7:
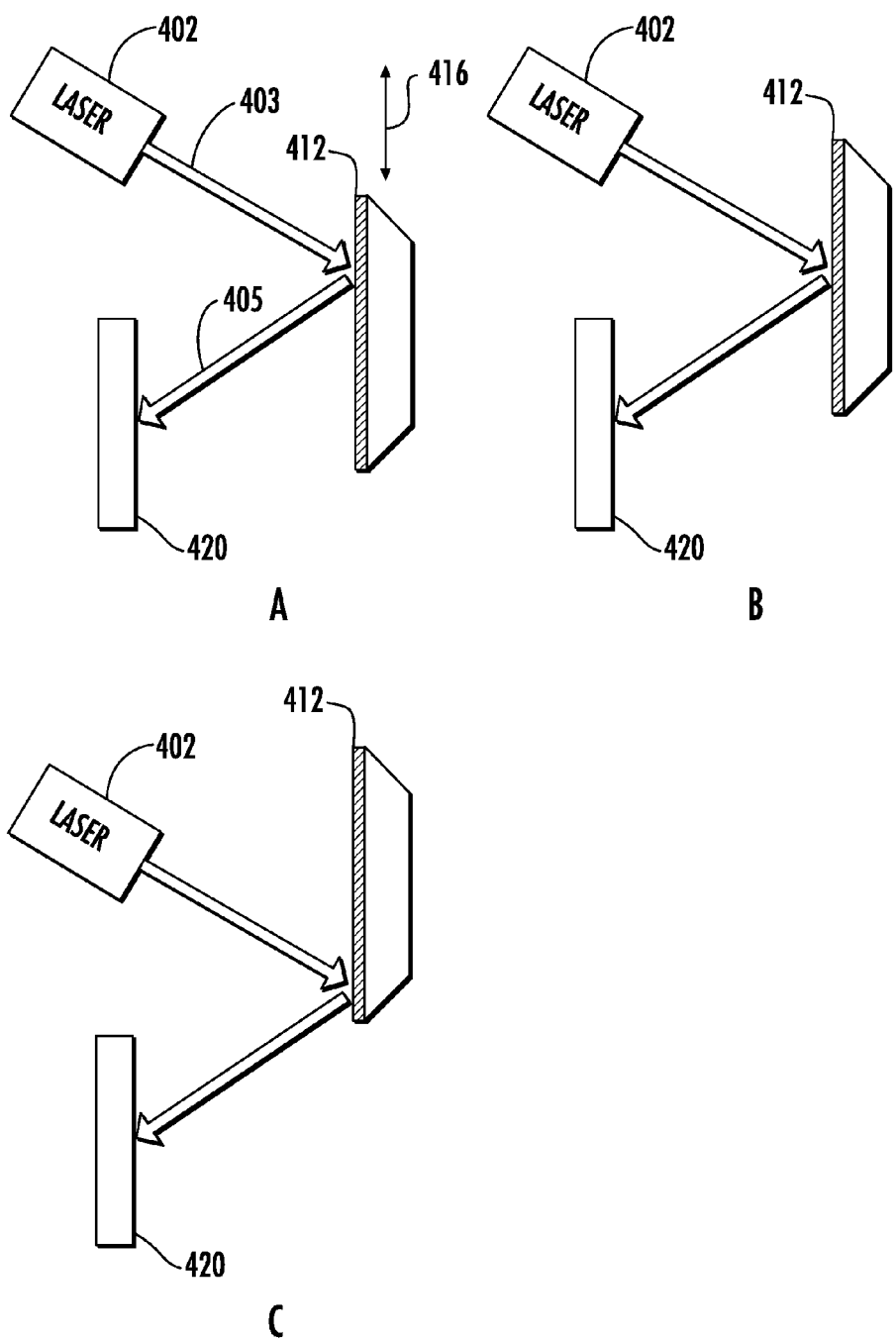
FIGS. 7A-C is a side view of the laser scanning of a flat platen in three different positions.

FIGS. 7A-C show three positions of the platen 200 as it is moved in the direction 416. In this figure, the platen 200 is relatively flat, so at all three positions, the reflected laser beam 405 strikes the same location on the receptor region 420.

Figure 8:
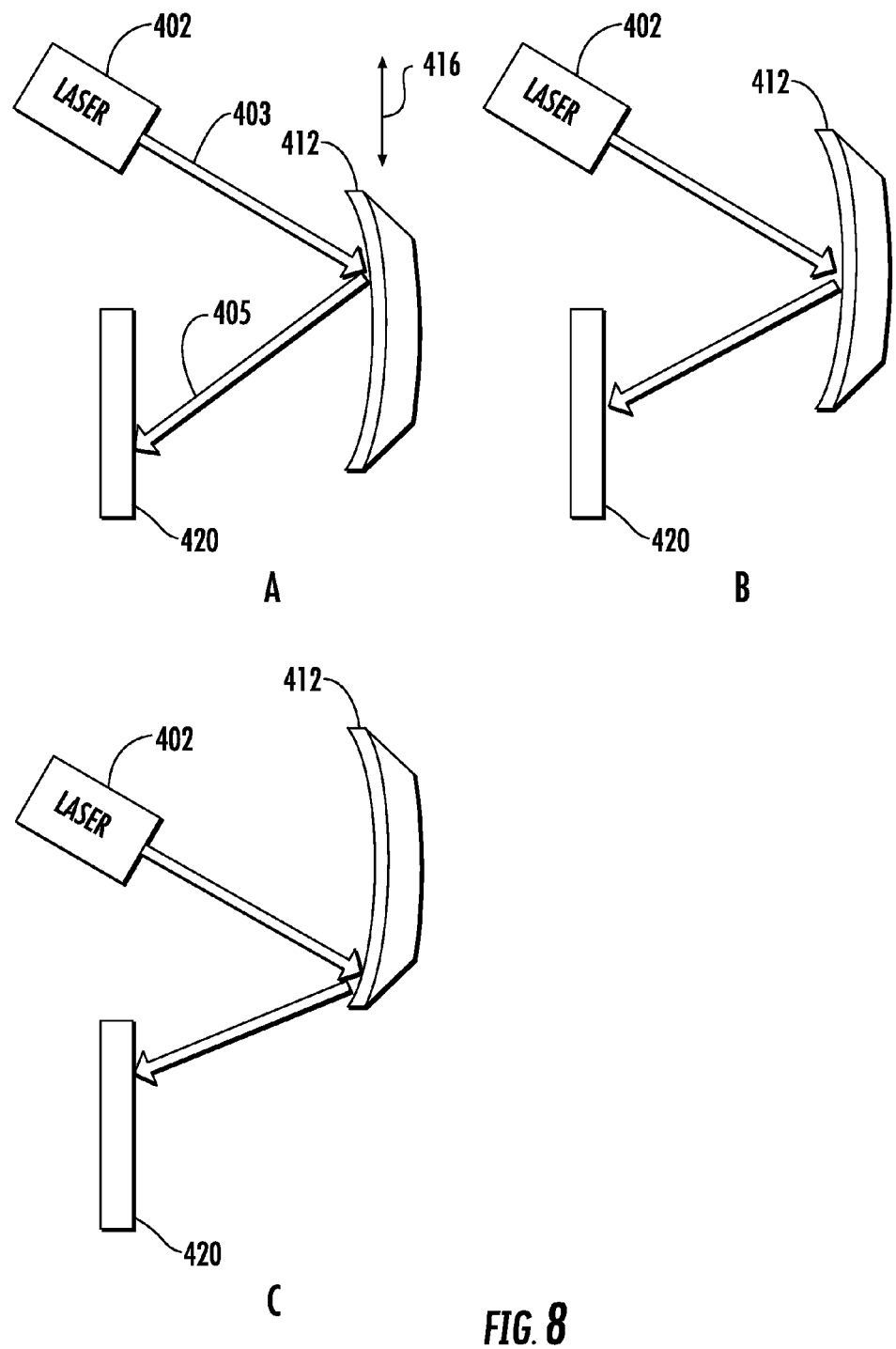
FIGS. 8A-C is a side view of the laser scanning of a concave platen in three different positions.

FIGS. 8A-C show three positions of a platen 220 as it is moved in the direction 416. In this figure, the platen 200 is concave, as may occur at high temperatures. Note that as the laser beam 403 is reflected, the position at which the reflected laser beam 405 strikes the receptor region 420 varies. In the case of a concave surface, the reflected beam 405 may move "up" the receptor region 420 as the platen 200 is moved upward.

Figure 9:
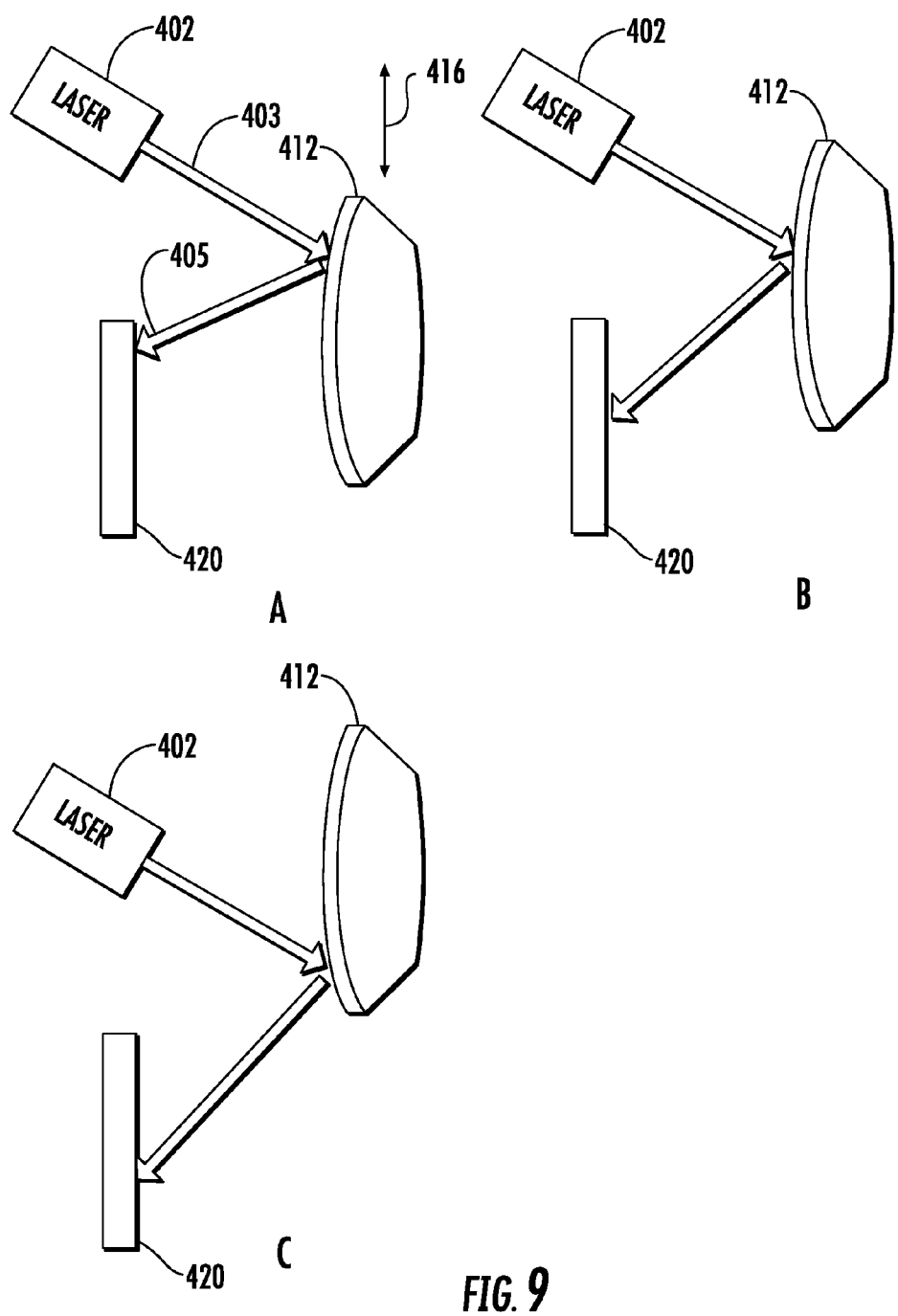
FIGS. 9A-C is a side view of the laser scanning of a convex platen in three different positions.

Conversely, FIGS. 9A-C show three positions of a convex platen 200 as it is moved in the direction 416. This convex shape may occur at low temperatures. Note that as the laser beam 403 is reflected, the position at which the reflected laser beam 405 strikes the receptor region 420 varies. In the case of a convex surface, the reflected beam 405 may move "down" the receptor region 420 as the platen 200 is moved upward.

Figure 6:
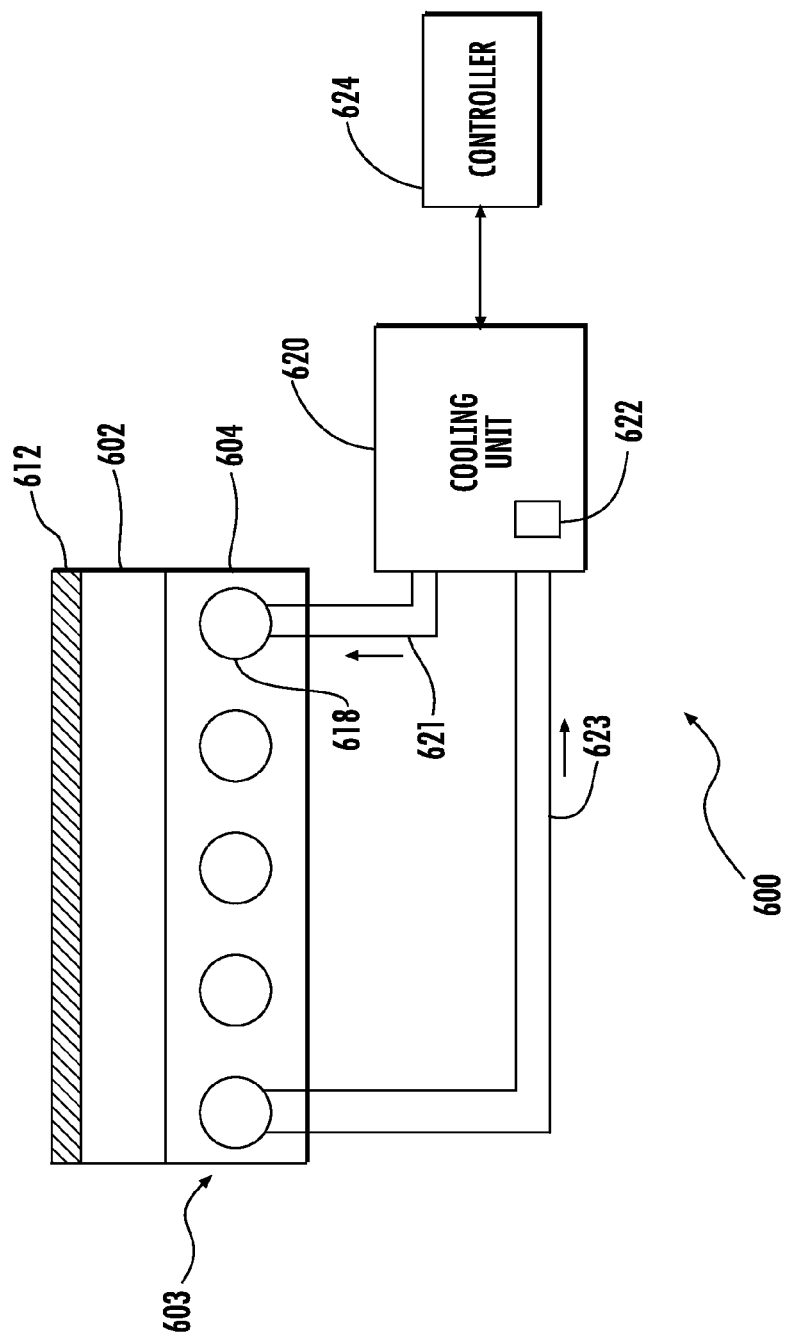
FIG. 6 is a block diagram of a cooling system consistent with an embodiment of the present disclosure.

Turning to FIG. 6, a block diagram of a cooling system 600 consistent with an embodiment of the present disclosure to maintain an operating temperature of the platen 603 at a desired temperature range to minimize platen curvature is illustrated. The cooling system 600 may include a cooling unit 620, an outlet conduit 621, an inlet conduit 623, a controller 624, and an associated conduit 618 located in a support layer 604 of the platen 603. A workpiece 612 may be clamped to the clamping surface of the clamping layer 602. The cooling unit 620 may include a temperature sensor 622 to monitor a temperature of incoming cooling fluid. In another embodiment, a temperature sensor may be used to directly monitor the temperature of the platen 603. The cooling unit 620 may also include a chiller. The controller 624 can be or include a general-purpose computer or network of general-purpose computers that may be programmed to perform desired input/output functions. For clarity of illustration, the controller 624 is shown separate from the cooling unit 620, although the controller 624 may be embedded in the cooling unit 620. The controller 624 can also include other electronic circuitry or components, such as application specific integrated circuits, other hardwired or programmable electronic devices, discrete element circuits, etc. The controller 624 may also include communication devices, data storage devices, and software. The controller 624 may receive input data and instructions from any variety of systems and components and control the cooling unit and hence the temperature of the platen 603.

In operation, the cooling system 600 monitors and controls the operating temperature range of the platen 603. The cooling unit 620 feeds cooling fluid, e.g., cooled water, through the outlet conduit 621 to the conduit 618 disposed in the support layer 604 of the platen 603. The cooling fluid circulates through the conduit 618 until it is fed back to the cooling unit 620 via the inlet conduit 623. The temperature sensor 622 may sense the temperature of the cooling fluid at the inlet port. In response, the cooling unit 620 may adjust its chilling operation to adjust, as needed, the temperature of the cooling fluid it delivers to the outlet conduit 621. In this way, a predetermined operating temperature range of the platen 603 may be maintained.

In one method consistent with the present disclosure, the laser system of FIG. 4 may be used to monitor the flatness of a particular platen during set up and, optionally during operating times. During a set up time, the platen 200 may be at one initial operating temperature. The cooling system of FIG. 6 may then be used to change the operating temperature of the platen and the laser system may again be used to monitor the flatness of the particular platen. Therefore, an optimal temperature may be determined during the set up procedure that minimizes any curvature of a particular platen by providing a desired platen flatness. The cooling system 600 may then operated to adjust the temperature of the platen 200 to the desired temperature and a closed loop control system may control the platen temperature during operation to maintain the temperature within a desired temperature range about the desired temperature. In one instance, the desired temperature may be 27° C. The laser system may also be used to continue to monitor platen flatness during ion implant.

Figure 10:
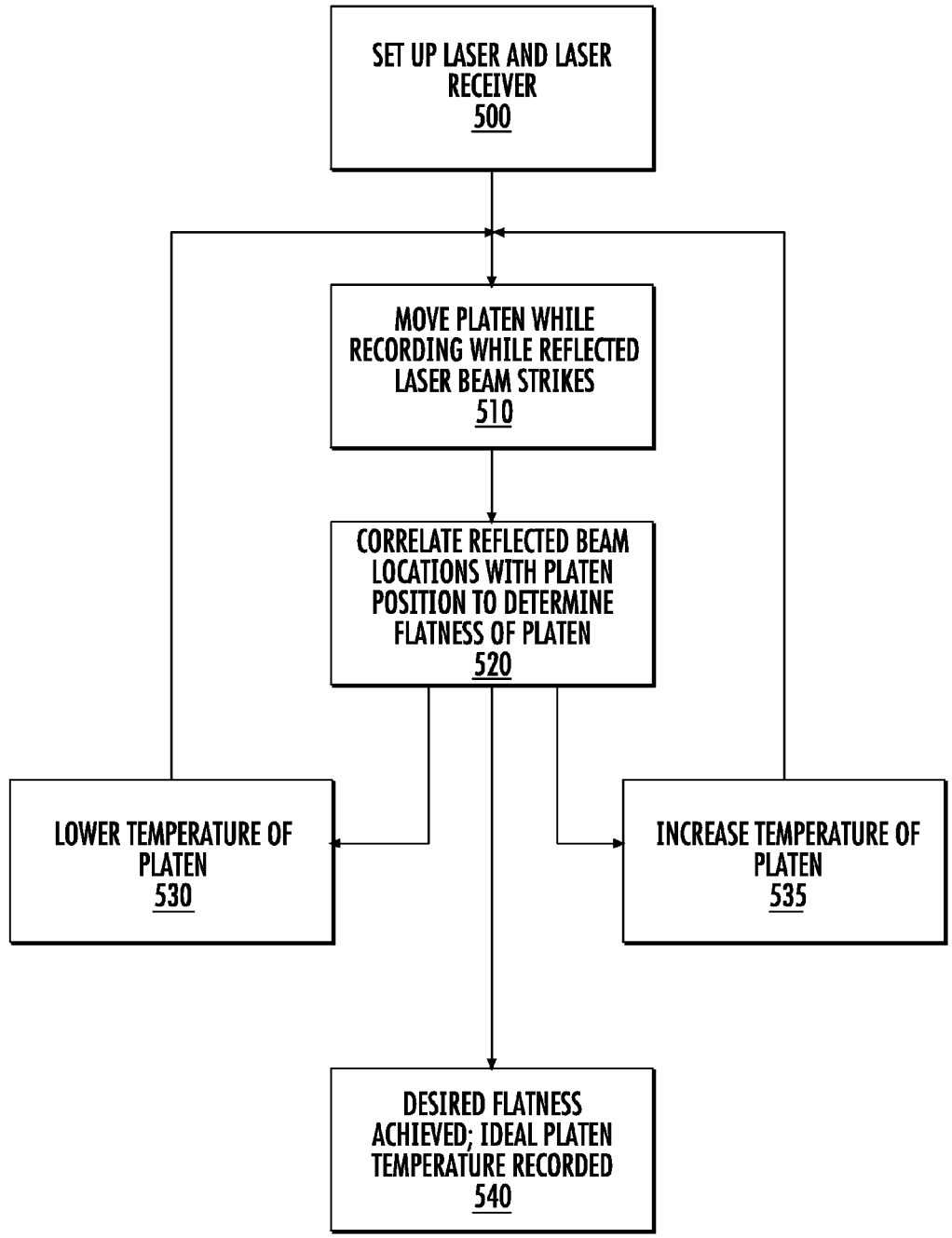
FIG. 10 is a flowchart according to one embodiment.

A flow chart of this method is shown in FIG. 10. First, a laser is directed toward the platen (or a workpiece clamped to the platen). In some embodiments, the laser is positioned at the vertical diameter of the platen, as shown in FIG. 5. A laser receiver is positioned to receive the laser beam after it is reflected off the platen, as shown in step 500. The platen is then moved, such as in the vertical direction. The location where the reflected laser beam strikes is recorded and correlated with the vertical position of the platen, as shown in step 510. In some embodiments, this may be done continuously, while in other embodiments, discrete measurements are made. While the location of the reflected beam is one criteria that can be used, other criteria can also be used to determine platen flatness. For example, as described above, light intensity can be used. Other characteristics of the reflected laser beam may also be used. The results of step 510 are then interpreted to determine whether the platen is flat, concave or convex, as shown in step 520. The cooling system is then adjusted to modify the temperature of the platen, based on the interpreted results, found in step 520. For example, if the determination is made that the platen is concave, it may be necessary to further cool the platen, as shown in step 530. Conversely, if the platen is found to be convex, the platen may need less cooling, as shown in step 535. If the platen is determined to be flat within the desired tolerance, the platen temperature is recorded and the set up process is complete, as shown in step 540. In some embodiments, the deviation in the reflected beam locations found in step 510 is used to determine the amount of change in temperature that should be applied to the platen. For example, as the reflected beam locations get closer to one another, the amount of temperature change needed decreases. A control loop can be used to convert the deviation in reflected locations into a desired temperature change. In some embodiments, a PID (proportional-integral-derivative) control loop is used. In other embodiments, less sophisticated control systems are used during set up. Steps 510-535 may be repeated until the desired level of flatness is achieved. As a further enhancement to this method, the laser may be directed to a different portion of the platen. For example, if the platen were rotated about its center by 90°, the laser would effectively be directed at the horizontal diameter. Of course, other translations or rotations of the platen may be used to allow the laser to be directed at more positions on the platen. In another embodiment, the laser and laser receiver are moved while the platen remains stationary. In other words, relative movement between the incoming laser beam and the platen is required and can be achieved using a variety of methods.

In some embodiments, once this optimal or ideal platen temperature is determined, it is then recorded and used as one parameters of the implant process. In other words, the laser system of FIG. 4 may not be used during normal operation. Thus, the platen temperature determined in step 540 is used during implanting. A closed loop cooling control system, such as illustrated in FIG. 6, may then control the platen temperature during operation to maintain this temperature within a desired temperature range.

The controller used to determine the appropriate temperature changes (steps 530-540) may be the same as controller 624 used to control the cooling system 600. In other embodiments, a separate controller is used to perform the method of FIG. 10. This separate controller communicates with controller 624 to affect the temperature of the platen 200, using any communication means known in the art.

Figure 11:
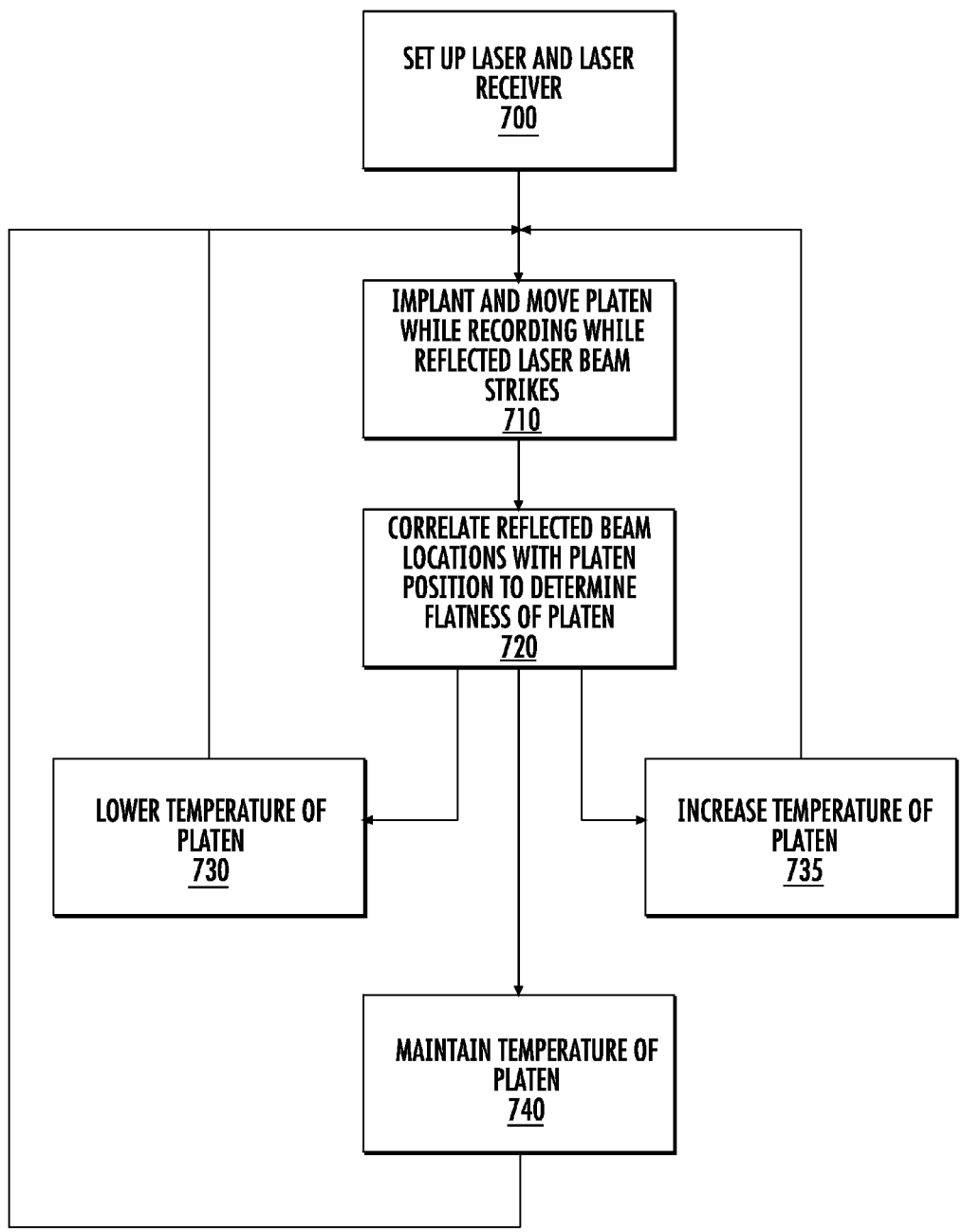
FIG. 11 is a flowchart according to one embodiment.

In another embodiment, the sequence similar to that shown in FIG. 10 is used during normal operation as well. In this embodiment, shown in FIG. 11, the sequence is not used to determine a specific temperature to control the cooling system, rather it continuously monitors the flatness of the platen. In this embodiment, since the laser is operational during ion implantation, the movement of the platen (step 710) is done during the scanning of the ion beam, and may not be controlled by the laser process (unlike step 510). Furthermore, when the platen is determined to be flat (step 740), the platen temperature is maintained, by directing the cooling system 600 to maintain its current temperature. In other words, in this embodiment, the controller 624 is not used to maintain a specific temperature. Rather, it is used to maintain a specific platen flatness, regardless of the resulting temperature.

In another embodiment consistent with the disclosure for an ion implanter processing tool, a particular recipe may be correlated to a desired temperature based on previous experimental data associated with parameters such as beam energy, beam current, and dose. A closed loop cooling control system such as illustrated in FIG. 6 may then control the platen temperature during operation to maintain the temperature within a desired temperature range about the desired temperature.

While this disclosure describes methods and system for maintaining platen flatness, it is understood that this method and system can be used to maintain any desired level of curvature. For example, in some embodiments, it may be beneficial to have a concave or convex workpiece. In these scenarios, the system and method described herein may be used to create this level of curvature.

In other embodiments, a different mechanism is used to determine the curvature of the platen. For example, in some embodiments, Rutherford backscattering (RBS) is used. This is a standard analytical method, often used for depth profiling of solid state samples, but also very sensitive to crystal orientation. A measurement of platen curvature may be achieved by having an accurately positioned source of high energy, low mass ions (such as an alpha particle radioactive source) and an accurately positioned detector (such as a solid state surface barrier detector) located in the vacuum chamber facing the workpiece. If the radiation is collimated by an aperture to only illuminate a small (e.g. 1 mm diameter) spot on the wafer, and the detector is positioned off to the side so that it only detects backscattered alpha particles that have not been accepted into the channel, the wafer could be rotated in various angles using the angle control mechanism of the implanter until the scattered signal falls to a minimum. This orientation would be the one where the crystal lattice was accurately lined up with the direction of the particle beam.

In another embodiment, a contact probe such as those used in coordinate measurement machines could also be used to locate the surface of the wafer. Profilometers are, in general, systems that measure the "height" of a surface as it is translated by a mechanical transport system. The ion implanter has such a mechanical transport system. Various types of probe may be used to detect the surface of the workpiece.

In one embodiment, used in coordinate measurement machines used to validate the machining of parts, a steel stylus with an end that may have an accurately dimensioned spherical bearing surface is used. Such mechanical profilometers are capable of resolutions within a few nanometers. This steel stylus actually makes contact with the surface to be measured. Use of a dummy wafer would eliminate the concern of damaging a valuable workpiece during the execution of the test to select the best operating temperature. Other techniques which do not contact the workpiece may also be used. Optical systems are also capable of nanometer resolution.

A technology known as atomic force microscopy (AFM) is a similar approach, where an electrical current tunnels quantum mechanically from the probe to the surface. A feedback control then servos the position of the probe to maintain a constant tunneling current. Such systems are capable of resolution of a few picometers.

In another embodiment, capacitance is also used as a non-contact proximity sensor and may be used in determining the flatness or curvature of a platen.

In one embodiment, a high energy implant, such as greater than 1 MeV, may be performed where maximum channeling is desirable. Maximum channeling may be achieved during a "true zero" implant, where the trajectory of the implanted ions is aligned with the internal lattice structure of the workpiece. This may occur when the surface of the workpiece is perpendicular to the ion beam; in other embodiments, this may occur at a defined tilt angle. However, in order to maximize channeling across the entire workpiece, it may be necessary to have an optimal platen curvature. For example, in some embodiments, the optimal curvature of the platen may be required to be less than 0.1°. To accomplish this "true zero" implant, the techniques described above may be used to determine and control the curvature of the platen. In one particular embodiment, a 3 MeV boron implant may be performed on a workpiece disposed on a platen that is temperature controlled as described above. By controlling the temperature of the platen, it is possible to achieve a high degree of flatness such as a platen curvature of less than 0.1°, and more particularly less than 0.01°. Thus, "true zero" implants are made possible by controlling the temperature of the platen.

There has thus been provided a platen flatness control system and method. In one experiment, by adjusting the operating temperature of the platen, the curvature of the clamping surface of the platen was reduced to only 0.01 degrees. When used in an ion implanter treating a semiconductor wafer, the measured uniformity of the wafer using a Thermawave® probe was 0.24-0.27%. Accordingly, a fast and cost-efficient apparatus and method for minimizing platen curvature has been provided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A system for maintaining a curvature of a platen, comprising:
    means for measuring data related to said curvature of said platen;
    a controller adapted to determine said curvature of said platen based on said data from said means and to adjust a temperature of said platen based on said determined curvature; and
    a cooling system for maintaining said temperature of said platen, comprising:
        a cooling fluid;
        a cooling unit to cool said cooling fluid; and
        a conduit within said platen through which said cooling fluid passes,
        wherein said controller is further adapted to determine an optimal temperature and said cooling system comprises a temperature sensor, and wherein said cooling system maintains said platen at said optimal temperature.

2. The system of claim 1, wherein said means for measuring curvature comprises:
    a laser for emitting a laser beam directed at said platen; and
    a laser receiver for receiving a reflected laser beam.

3. The system of claim 2, wherein said data comprises location data about said reflected laser beam.

4. The system of claim 2, wherein said data comprises intensity of said reflected laser beam.

5. The system of claim 1, wherein said means for measuring data related to said curvature is selected from the group consisting of a mechanism employing Rutherford backscattering, a profilometer, an atomic force microscope and a non-contact capacitance proximity sensor.

6. The system of claim 1, wherein said controller is adapted to adjust said temperature of said platen to achieve a desired platen curvature, and said desired platen curvature is less than 0.1°.

7. A system for maintaining a curvature of a platen, comprising:
    a laser for emitting a laser beam directed at said platen;
    a laser receiver for receiving a reflected laser beam, wherein said laser receiver measures data related to said curvature of said platen;
    a controller adapted to determine said curvature of said platen based on said data from said laser receiver and to adjust a temperature of said platen based on said determined curvature; and
    a cooling system for maintaining said temperature of said platen, comprising:
        a cooling fluid;
        a cooling unit to cool said cooling fluid; and
        a conduit within said platen through which said cooling fluid passes.

8. The system of claim 7, wherein said data comprises location data about said reflected laser beam.

9. The system of claim 7, wherein said data comprises intensity of said reflected laser beam.

10. The system of claim 7, further comprising a scanning system to move said platen while said laser beam is directed at said platen so that said laser received receives a plurality of reflected laser beams from a plurality of locations.

11. The system of claim 10, wherein said controller determines whether the platen is convex or concave based on said plurality of reflected laser beams.

12. The system of claim 7, wherein said controller is adapted to adjust said temperature of said platen to achieve a desired platen curvature, and said desired platen curvature is less than 0.1°.

13. A system for maintaining a curvature of a platen, comprising:
  means for measuring data related to said curvature of said platen;
  a controller adapted to determine said curvature of said platen based on said data from said means and to adjust a temperature of said platen based on said determined curvature; and
  a cooling system for maintaining said temperature of said platen, comprising:
    a cooling fluid;
    a cooling unit to cool said cooling fluid; and
    a conduit within said platen through which said cooling fluid passes,
    wherein said means for measuring data related to said curvature is selected from the group consisting of a mechanism employing Rutherford backscattering, a profilometer, an atomic force microscope and a non-contact capacitance proximity sensor.

14. The system of claim 13, wherein said controller is adapted to adjust said temperature of said platen to achieve a desired platen curvature, and said desired platen curvature is less than 0.1°.

* * * * *